(12) United States Patent
Zhang

(10) Patent No.: US 11,183,544 B2
(45) Date of Patent: Nov. 23, 2021

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Feng Zhang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 37 days.

(21) Appl. No.: 16/612,428

(22) PCT Filed: Sep. 19, 2019

(86) PCT No.: PCT/CN2019/106673
§ 371 (c)(1),
(2) Date: Nov. 11, 2019

(87) PCT Pub. No.: WO2020/258541
PCT Pub. Date: Dec. 30, 2020

(65) Prior Publication Data
US 2020/0411610 A1    Dec. 31, 2020

(30) Foreign Application Priority Data
Jun. 25, 2019   (CN) .......................... 201910556655.X

(51) Int. Cl.
*H01L 27/32* (2006.01)
*H01L 51/56* (2006.01)

(52) U.S. Cl.
CPC ...... *H01L 27/3234* (2013.01); *H01L 27/3246* (2013.01); *H01L 27/3276* (2013.01); *H01L 51/56* (2013.01)

(58) Field of Classification Search
None
See application file for complete search history.

(56) References Cited

U.S. PATENT DOCUMENTS

2018/0293936 A1* 10/2018 Fujioka ............... H01L 51/5203
2018/0308417 A1  10/2018 Xie et al.
2019/0310724 A1* 10/2019 Yazdandoost ......... G06F 3/0412
2019/0326378 A1* 10/2019 Kim ..................... H01L 27/3262
2020/0052048 A1*  2/2020 Kuo ....................... G06F 1/1626

FOREIGN PATENT DOCUMENTS

CN    107610635 A    1/2018
CN    110392146 A    10/2019

* cited by examiner

*Primary Examiner* — Khaja Ahmad
(74) *Attorney, Agent, or Firm* — Mark M. Friedman

(57) ABSTRACT

The invention discloses a display panel and a display device. The display panel includes a display area, wherein the display area includes an image capturing area and a non-image capturing area surrounding the image capturing area, and the display area further includes: a plurality of light emitting units distributed in the image capturing area and the non-image capturing area; and a plurality of pixel circuit units, each of the pixel circuit units respectively connected to a corresponding one of the light emitting units, wherein each of the pixel circuit units is disposed in the non-image capturing area.

16 Claims, 5 Drawing Sheets

DISPLAY PANEL AND DISPLAY DEVICE

BACKGROUND OF INVENTION

Field of Invention

The present invention relates to a field of display, and in particular, to a display panel and a display device.

Description of Prior Art

As a new display technology, an organic light-emitting diode (OLED) has some advantages that other display technologies can't match, such as wide viewing angles, high contrast, fast response times, low power consumption, and being foldable/flexible etc., thus having strong competitiveness in a new era of display.

Full screen technology is a broader definition of mobile phones of ultra-high screen-to-body ratios in industry. Literally, the front of the mobile phone is all screens. The display interface of the mobile phone is completely covered by the screen, and four borders of each of the mobile phones are designed to be bezel free, to pursuit close to 100% of the ultra-high screen-to-body ratio. However, it is limited by other basic functions that are indispensable to mobile phones such as a mobile phone front camera, a mobile phone earpiece, a distance sensor, a light sensor, and so on. At present, there is a certain notch at the top of the mobile phone screen to accommodate the above functional components. The claimed full-screen mobile phone is merely a mobile phone with a super high screen-to-body ratio, but not 100% of screen-to-body ratio in the front screen of the mobile phone, that is so-called "notch screen". With the ultra-narrow bezel design, its real screen-to-body ratio (unofficial publicity) can reach 80% to 90%, and there is still a certain distance away from the 100% full screen.

With the extensive development and in-depth applications of OLED technology, the pursuit of high-screen-to-body ratio (even full-screen) display with better visual experience has become one of the trends of current display technology development, such as under-display fingerprint recognition technology, under-display sensing technology, and O-Cut technology, which have greatly improved the screen-to-body ratio of the display screen, but under-display camera technology still faces many constraints such as processes or structural designs.

A compensation pixel circuit unit of an active-matrix organic light-emitting diode (AMOLED) display panel is provided with a large amount of opaque metal traces (such as GE1, GE2, and SD, etc.) in the array substrate, which will seriously attenuate transmittance of external light and produce a significant "screen-door effect", thus impacting the image capturing effect of the under-screen camera, and there is still a need for further design, research, and development for the current OLED display technology to realize a real full-screen era.

SUMMARY OF INVENTION

In order to solve the above problems, the present invention provides a display panel and a display device for solving the problem of the decreased transmittance caused by opaque technique of an image capturing area in the prior art.

A technical solution for solving the above problems is that the present invention provides a display panel including an image capturing area and a non-image capturing area surrounding the image capturing area, and the display area further includes: a plurality of light emitting units distributed in the image capturing area and the non-image capturing area; and a plurality of pixel circuit units, each of the pixel circuit units connected to a corresponding one of the light emitting units, wherein each of the pixel circuit units is disposed in the non-image capturing area.

Further, the light emitting units are arranged in a plurality of rows and columns of an array; in a direction of the rows, the image capturing area has a first width; in a direction of the columns, the non-image capturing area has a first region, wherein a width of the first region and the first width of the image capturing area correspond to each other and are consistent; in a direction of the columns, the image capturing area has a second width; in the direction of the rows, the non-image capturing area has a second region, and a width of the second region and the second width of the image capturing area correspond to each other and are consistent; a region outside the second region and the first region in the non-image capturing area is a third region; and the pixel circuit units corresponding to the light emitting units in the image capturing area are all distributed in the first region and/or the second region.

Further, the first width is a maximum width of the image capturing area in the direction of the rows; in the direction of the columns, a first gap is located between two adjacent pixel circuit units in the first region, wherein a width of the first gap is gradually decreased in a direction from a side away from the image capturing area to a side close to the image capturing area.

Further, the second width is a maximum width of the image capturing area in the direction of the columns; in the direction of the rows, a second gap is located between two adjacent pixel circuit units in the second region, wherein a width of the second gap is gradually decreased in a direction from a side away from the image capturing area to a side close to the image capturing area.

Further, the first width is less than a maximum width of the image capturing area in the direction of the rows; the second width is less than a maximum width of the image capturing area in the direction of the columns; the third region and the image capturing area include at least one intersection disposed on a boundary of the image capturing area; in the direction of the columns, a third gap is located between two adjacent pixel circuit units in the first region, wherein a width of the third gap is gradually decreased in a direction from a side away from the image capturing area to a side close to the image capturing area; in the direction of the rows, a fourth gap is located between two adjacent pixel circuit units in the second region, wherein a width of the fourth gap is gradually decreased in a direction from a side away from the image capturing area to a side close to the image capturing area.

Further, the display panel further includes an array substrate; and the array substrate includes a substrate on which a thin film transistor structure is disposed, wherein the thin film transistor structure includes: an active layer disposed on the substrate; a first insulating layer disposed on the substrate and covering the active layer; a first metal layer disposed on the first insulating layer; a second insulating layer disposed on the first insulating layer and covering the first metal layer; a second metal layer disposed on the second insulating layer; a dielectric layer disposed on the second insulating layer and covering the second metal layer; a source/drain layer disposed on the dielectric layer, the source/drain layer penetrating the dielectric layer to the active layer and electrically connected to the active layer; and a planarization layer disposed on the dielectric layer and covering the source/drain layer, wherein the light emitting units include an electrode trace, the pixel circuit units include the source/drain layer, and the electrode trace is electrically connected to the source/drain layer.

Further, the light emitting unit further includes the light emitting unit further includes: a pixel defining layer disposed on the electrode trace, wherein the pixel defining layer is provided with an opening corresponding to the electrode trace; and a light emitting layer disposed in the opening.

Further, the electrode trace is disposed on the planarization layer, and the electrode trace is electrically connected to the source/drain layer through the planarization layer.

Further, the image capturing area is circular, and the first width and the second width are strings or diameters of the image capturing area.

The present invention also provides a display device including the display panel.

In the display panel and the display device of the present invention, the light emitting unit are distributed in the image capturing area and the non-image capturing area in an array, so that the image capturing area can achieve the effect of displaying the image, and the full screen design is realized. Pixel circuit units correspondingly connected to the light emitting units in the image capturing area are moved into the non-image capturing area by stepwise indentation, reducing the impact of the opaque metal traces in the pixel circuit units on the transmittance of the image capturing area and effectively attenuating the "screen-door effect". Meanwhile, the non-imaging capturing area is divided into a plurality of regions, to minimize the increase of the electrode traces in the light-emitting unit due to the movement of the pixel circuit units, thereby saving cost.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

Figure 1:
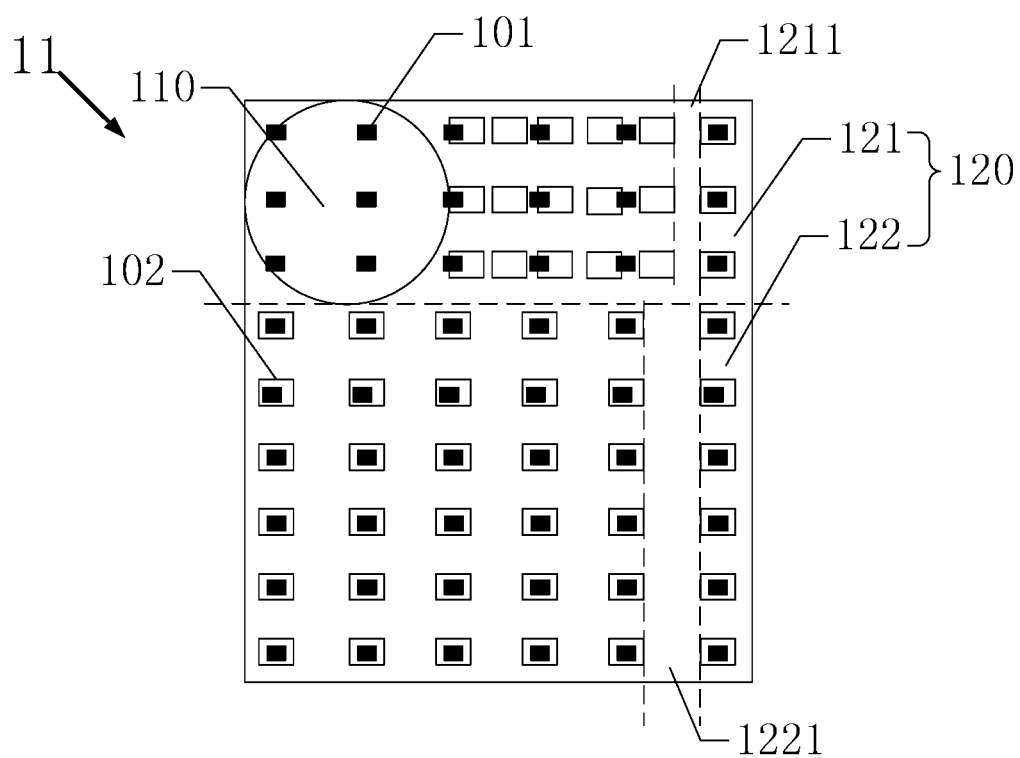
FIG. 1 is a schematic view showing a display panel in Embodiment 1.

In the drawing:
10 display panel; 11 display area; 110 image capturing area;
120 non-image area; 101 light emitting unit; 102 pixel circuit unit;
121 first region; 122 second region;
1211 first gap; 1221 second gap; 10101 electrode trace;
10102 pixel definition layer; 10103 light emitting layer; 10211 substrate;
10212 active layer; 10213 first insulating layer; 10214 first metal layer;
10215 second insulating layer; 10216 second metal layer;

-continued 10217 dielectric layer; 10218 source/drain layer; 10219 planarization layer;
123 third region; 124 fourth region; 1231 third gap; 1241 fourth gap;
125 fifth region; 126 sixth region; 127 seventh region;
12701 intersection; 1251 fifth gap; 1261 sixth gap;

DETAILED DESCRIPTION OF PREFERRED EMBODIMENTS

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

Embodiment 1

In this embodiment, the display panel 10 of the present invention is a full-screen display panel, as shown in FIG. 1, which includes a display area 11. In order to realize the camera function of the display panel 10. The display area 11 includes an image capturing area 110 and a non-image capturing area 120, a plurality of light emitting units 101 distributed in the image capturing area 110 and the non-image capturing area 120 in rows and columns, and light emitting units 101 include red light emitting units, green light emitting units, and blue light emitting units arranged at intervals for image display on the display panel 10; and further includes a plurality of pixel circuit units 102, each of the pixel circuit units 102 connected to a corresponding one of the light emitting units 101 for providing power to the light-emitting units 101 to emit light.

Figure 5:
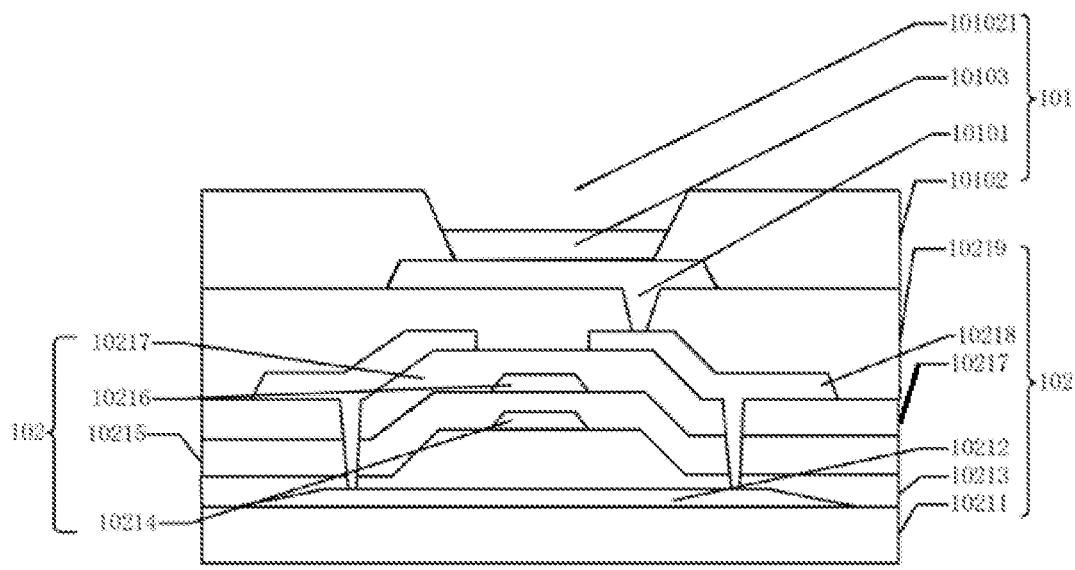
FIG. 5 is a side view showing a display panel in Embodiment 1.
Figure 6:
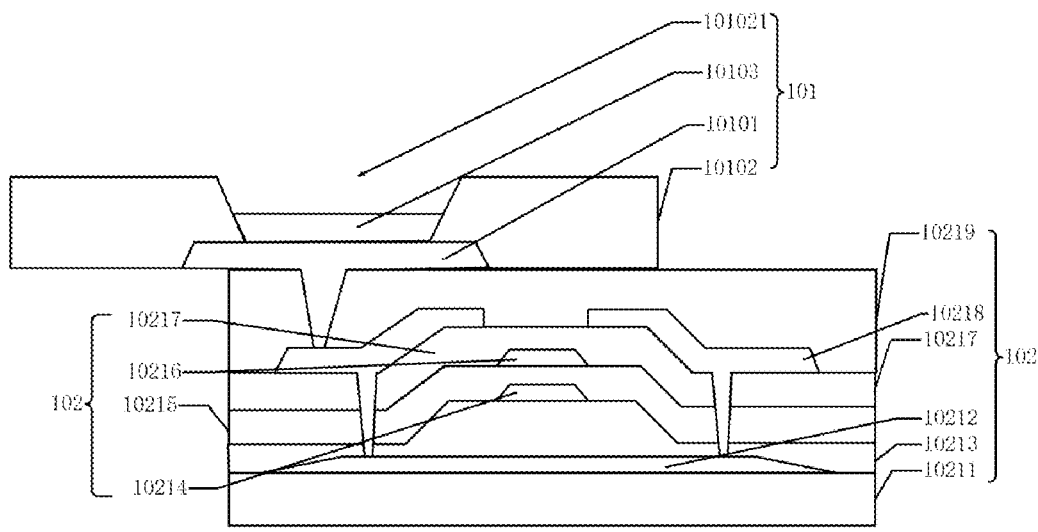
FIG. 6 is a side view showing "dislocation" of a display panel in Embodiment 1.

As shown in FIGS. 5 and 6, the light emitting unit 101 includes an electrode trace 10101, a pixel defining layer 10102, and a light emitting layer 10103.

The electrode trace 10101 is used to connect the pixel circuit units 102 to realize power transmission.

The pixel defining layer 10102 is disposed on the electrode trace 10101, wherein the pixel defining layer 10102 is provided with an opening 101021 corresponding to the electrode trace 10101; and a light emitting layer 10103 disposed in the opening 101021 to realize the conversion of electrical energy and light energy, lighting the display panel 10.

The display panel 10 includes a substrate 10211, an active layer 10212, a first insulating layer 10213, a first metal layer 10214, a second insulating layer 10215, a second metal layer 10216, a dielectric layer 10217, a source/drain layer 10218, and a planarization layer. 10219, wherein the pixel circuit unit includes the source/drain layer 10218.

The active layer 10212 is disposed on the substrate 10211. The first insulating layer 10213 is disposed on the substrate 10211 and covers the active layer 10212 to prevent the active layer 10212 from being short-circuited.

The first metal layer 10214 is disposed on the first insulating layer 10213, and the second insulating layer 10215 is disposed on the first insulating layer 10213 and covers the first metal layer 10214, the second metal layer 10216 is disposed on the second insulating layer 10215, and the dielectric layer 10217 is disposed on the second insulating layer 10215 and covers the second metal layer 10216 to keep the second metal layer 10216 insulated from other metal layers. The source/drain layer 10218 is disposed on the dielectric layer 10217, and the source/drain layer 10218 penetrates the dielectric layer 10217 to the active layer 10212 and electrically connected to the active layer 102121, thereby realizing the purpose of the pixel circuit unit 102 transmitting an electrical signal.

In order to realize the "full-screen", in this embodiment, the light emitting unit 101 is distributed in the image capturing area 110 and the non-image capturing area 120, so the image capturing area 110 can also be used to display an image. However, since the pixel circuit units include a plurality of opaque metal traces, the pixel circuit units are only distributed in the non-image capturing area 120 in order to improve the problem of the reduced image quality of the image capturing area 110 caused by the opaque metal traces.

Specifically, in order to realize that all the pixel circuit units are disposed in the non-image capturing area 120, in this embodiment, the non-image capturing area 120 is divided into a first region 121 and a second region 122.

In the row direction of the light emitting unit 101, the image capturing area 110 has a first width. In the embodiment, the image capturing area 110 is circular, and the first width is the diameter of the image capturing area 110.

In other preferred embodiments of the present invention, the shape of the image capturing area 110 may be an irregular shape?, and the first width is a maximum width of the image capturing area 110 in the direction of the rows.

A width of the first region 121 and the first width of the image capturing area correspond to each other and are consistent.

In order to ensure that each of the light emitting units 101 corresponds to one of the pixel circuit units 102, in this embodiment, widths of gaps between the pixel circuit units 102 in the first region 121 are gradually decreased to move the pixel circuit units that are originally disposed in the image capturing area 110 for connecting the light emitting units 101 to the non-image capturing area 120.

Specifically, in the direction of the columns of the light emitting unit 101, a first gap 1211 is located between two adjacent pixel circuit units 102 in the first region 121, wherein a width of the first gap 1211 is gradually decreased in a direction from a side of the first region 121 away from the image capturing area 110 to a side of the first region 121 close to the image capturing area 110 until the pixel circuit units 102 each corresponding to any one of the light-emitting units 101 in the image capturing area 110 are all disposed in the in the non-image capturing area 120.

Figure 2:
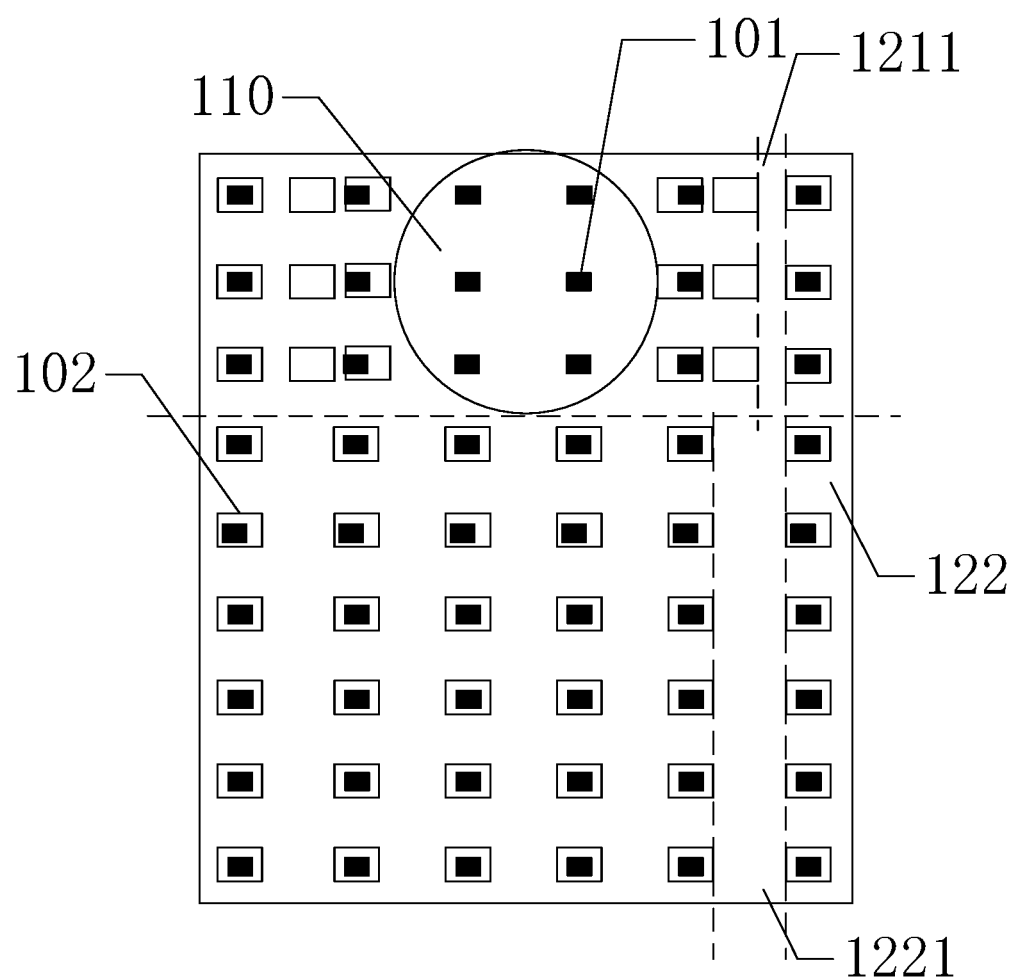
FIG. 2 is a schematic view showing another display panel in Embodiment 1.

As shown in FIG. 2, in another preferred embodiment of the present invention, the image capturing area 110 is located at an intermediate portion of the upper portion of the display area 11, that is, the first region 121 is divided into two part by the image capturing area 110. Widths of the gaps between pixel circuit units in the first region 121 at both sides of the imaging region 110 are gradually decreased in a direction from a side of the first region 121 away from the image capturing area 110 to a side of the first region 121 close to the image capturing area 110. As such, the design can minimize the length of the electrode traces 10101 connecting the light emitting units 101 to the pixel circuit units 102 in the image capturing area 110, thereby maximizing cost saving.

In order to enable effective connection between the light emitting units 101 in the image capturing area 110 and the corresponding pixel circuit units 102, in this embodiment, the electrode traces 10101 in the light emitting unit 101 are elongated to implement "dislocation" connections between the light emitting units 101 and the corresponding pixel circuit units 102.

A second gap 1221 is formed between the pixel circuit units 102 corresponding to the light emitting units 101 in the second region 122, and the width of any of the first gaps 1211 is less than or equal to the width of the second gap 1221 to ensure the optimization of the arrangement of the pixel circuit units 102 in the first region 121 and reduce the lengths of the electrode traces 10101 of the light emitting units 101, thereby saving the cost.

Embodiment 2

In this embodiment, the display panel 10 of the present invention is a full-screen display panel, including a display area 11. In order to realize the camera function of the display panel 10. The display area 11 includes an image capturing area 110 and a non-image capturing area 120, a plurality of light emitting units 101 distributed in the image capturing area 110 and the non-image capturing area 120 in rows and columns for image display on the display panel 10. The display area 11 further includes a plurality of pixel circuit units 102, each of the pixel circuit units 102 connected to a corresponding one of the light emitting units 101 for providing power to the light-emitting units 101 to emit light.

In order to realize the "full-screen", in this embodiment, the light emitting unit 101 is distributed in the image capturing area 110 and the non-image capturing area 120, so the image capturing area 110 can also be used to display an image. However, since the pixel circuit units include a plurality of opaque metal traces, the pixel circuit units are only distributed in the non-image capturing area 120 in order to improve the problem of the reduced image quality of the image capturing area 110 caused by the opaque metal traces.

Figure 3:
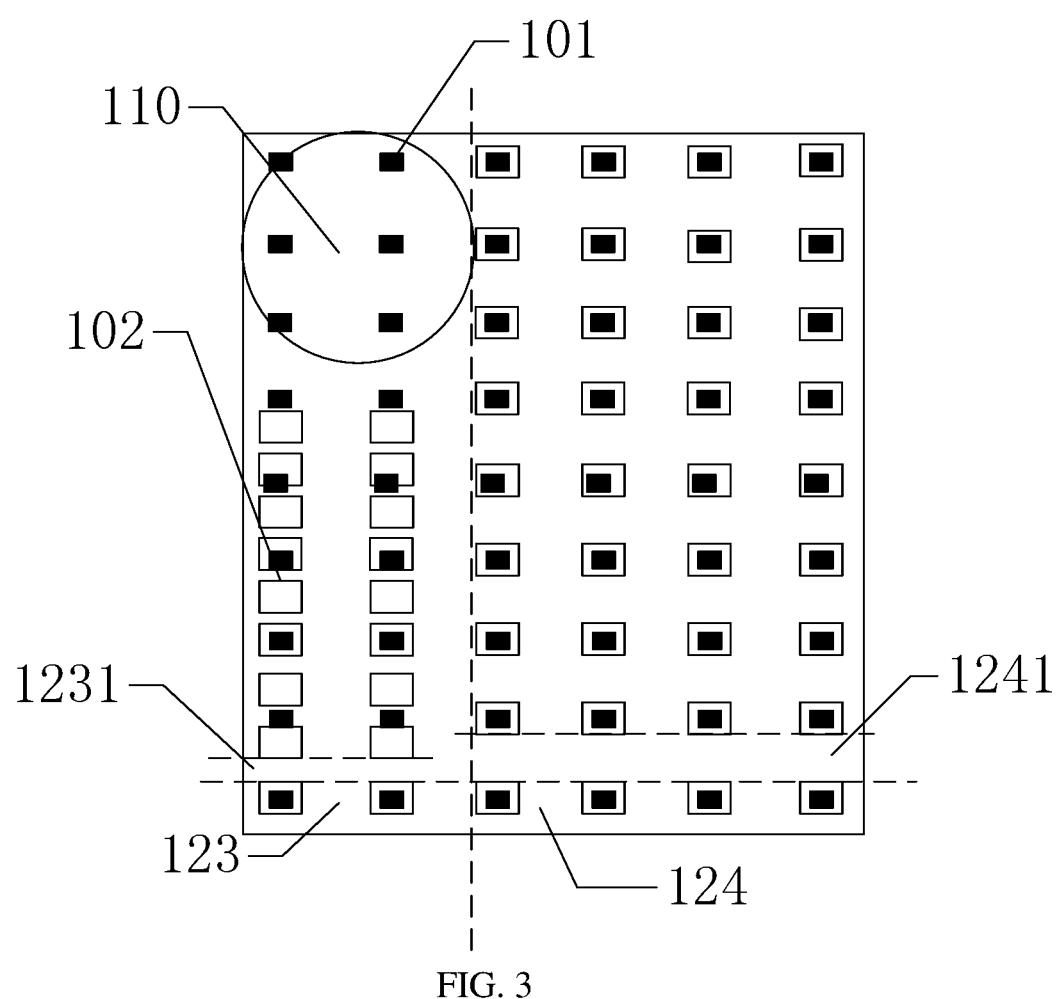
FIG. 3 is a schematic view showing a display panel in Embodiment 2.

As shown in FIG. 3, specifically, in order to realize that all the pixel circuit units are disposed in the non-image capturing area 120, in this embodiment, the non-image capturing area 120 is divided into a third region 123 and a fourth region. 124.

In the row direction of the light emitting unit 101, the image capturing area 110 has a second width. In the embodiment, the image capturing area 110 is circular, and the second width is the diameter of the image capturing area 110.

In other preferred embodiments of the present invention, the shape of the image capturing area 110 may be an irregular shape, and the second width is a maximum width of the image capturing area 110 in the direction of the rows.

A width of the third region 123 and the second width of the image capturing area correspond to each other and are consistent.

In order to ensure that each of the light emitting units 101 corresponds to one of the pixel circuit units 102, in this embodiment, widths of gaps between the pixel circuit units 102 in the third region 123 are gradually decreased to move the pixel circuit units that are originally disposed in the image capturing area for connecting the light emitting units 101 110 to the non-image capturing area 120.

Specifically, in the direction of the columns of the light emitting unit 101, a third gap 1231 is located between two adjacent pixel circuit units 102 in the third region 123, wherein a width of the third gap 1231 is gradually decreased in a direction from a side of the third region 123 away from the image capturing area 110 to a side of the third region 123 close to the image capturing area 110 until the pixel circuit units 102 each corresponding to any one of the light-emitting units 101 in the image capturing area 110 are all disposed in the in the non-image capturing area 120.

In order to enable effective connection between the light emitting units 101 in the image capturing area 110 and the corresponding pixel circuit units 102, in this embodiment, the electrode traces 10101 in the light emitting unit 101 are elongated to implement "dislocation" connections between the light emitting units 101 and the corresponding pixel circuit units 102.

A fourth gap 1241 is formed between the pixel circuit units 102 corresponding to the light emitting units 101 in the fourth region 124, and the width of any of the third gaps 1231 is less than or equal to the width of the fourth gap 1241 to ensure the optimization of the arrangement of the pixel circuit units 102 in the first region 121 and reduce the lengths of the electrode traces 10101 of the light emitting units 101, thereby saving the cost.

Embodiment 3

In this embodiment, the display panel 10 of the present invention is a full-screen display panel, including a display area 11. In order to realize the camera function of the display panel 10. The display area 11 includes an image capturing area 110 and a non-image capturing area 120, a plurality of light emitting units 101 distributed in the image capturing area 110 and the non-image capturing area 120 in rows and columns, and light emitting units 101 include red light emitting units, green light emitting units, and blue light emitting units arranged at intervals for image display on the display panel 10; and further includes a plurality of pixel circuit units 102, each of the pixel circuit units 102 connected to a corresponding one of the light emitting units 101 for providing power to the light-emitting units 101 to emit light.

In order to realize the "full-screen", in this embodiment, the light emitting unit 101 is distributed in the image capturing area 110 and the non-image capturing area 120, so the image capturing area 110 can also be used to display an image. However, since the pixel circuit units include a plurality of opaque metal traces, the pixel circuit units are only distributed in the non-image capturing area 120 in order to improve the problem of the reduced image quality of the image capturing area 110 caused by the opaque metal traces.

Figure 4:
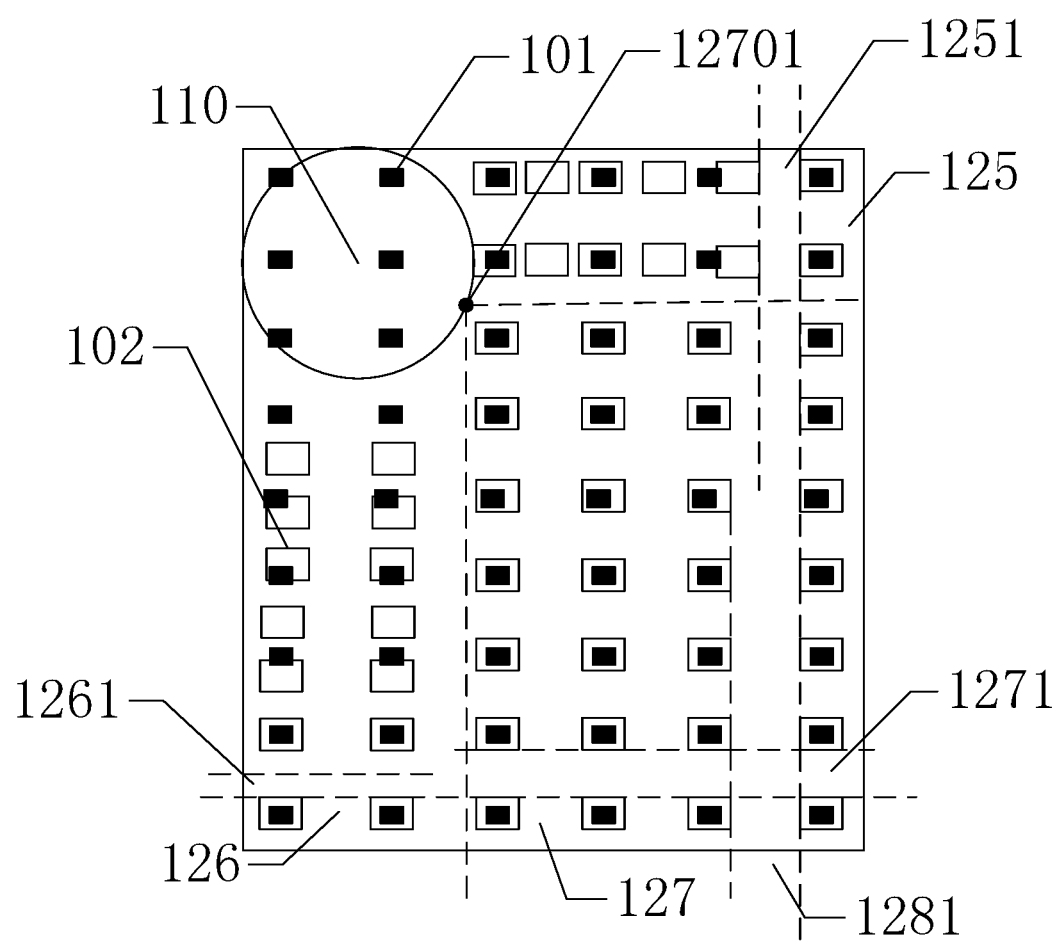
FIG. 4 is a schematic view showing a display panel in Embodiment 3.

As shown in FIG. 4, specifically, in order to realize that all the pixel circuit units are disposed in the non-image capturing area 120, in this embodiment, the non-image capturing area 120 is divided into a fifth region 125, a sixth region. 126, and a seventh region 127.

In the row direction of the light emitting unit 101, the image capturing area 110 has a third width. In the embodiment, the image capturing area 110 is circular, and the third width is smaller than the diameter of the image capturing area 110.

In other preferred embodiments of the present invention, the shape of the image capturing area 110 may be an irregular shape, and the third width is smaller than a maximum width of the image capturing area 110 in the direction of the rows.

In the direction of the columns of the light emitting unit 101, the image capturing area 110 has a fourth width. In this embodiment, the image capturing area 110 is circular, and the fourth width is smaller than the diameter of the image capturing area 110.

In other preferred embodiments of the present invention, the shape of the image capturing area 110 may be an irregular shape, and the fourth width is smaller than a maximum width of the image capturing area 110 in the direction of the rows.

A width of the fifth region 125 and the third width correspond to each other and are consistent, and a width of the sixth region 126 and the fourth width correspond to each other and are consistent.

The seventh region 127 is the remaining area of the non-image capturing area 120 after excluding the fifth region 125 and the sixth region 126.

In this embodiment, the seventh region 127 and the image capturing area 110 have only one intersection 1271, and the intersection 1271 falls on a boundary of the image capturing area 110.

In order to ensure that each of the light emitting units 101 corresponds to one of the pixel circuit units 102, in this embodiment, widths of gaps between the pixel circuit units 102 in the fifth region 125 are gradually decreased to achieve the movement of the pixel circuit units connecting the light emitting units 101 in the image capturing area 110 into the non-image capturing area 120.

Specifically, in the direction of the columns of the light emitting unit 101, a fifth gap 1251 is located between two adjacent pixel circuit units 102 in the fifth region 125, wherein a width of the fifth gap 1251 is gradually decreased in a direction from a side of the fifth region 125 away from the image capturing area 110 to a side of the fifth region 125 close to the image capturing area 110.

In the direction of the columns of the light emitting unit 101, a sixth gap 1261 is located between two adjacent pixel circuit units 102 in the sixth region 126, and a width of the sixth gap 1261 is gradually decreased in a direction from a side of the sixth region 126 away from the image capturing area 110 to a side of the sixth region 126 close to the image capturing area 110.

The pixel circuit units 102 each corresponding to any of the light-emitting units 101 in the image capturing area 110 are all distributed in the fifth region 125 or the sixth region 126.

In the direction of the rows, a seventh gap 1271 is located between the pixel circuit units 102 corresponding to the light emitting units 101 in the seventh region 127.

In the direction of the column directions, an eighth gap 1281 is located between the pixel circuit units 102 corresponding to the light emitting units 101 in the seventh region 127.

A width of any of the fifth gaps 1251 is less than or equal to a width of the eighth gap 1281, and a width of any of the sixth gaps 1261 is less than or equal to a width of the seventh gap 1271.

In order to ensure the optimization of the arrangement of the pixel circuit units 102 in the fifth region 125 and the sixth region 126, reduce the lengths of the electrode traces 10101 of the light emitting units 101 are reduced, thereby saving the cost.

Figure 7:
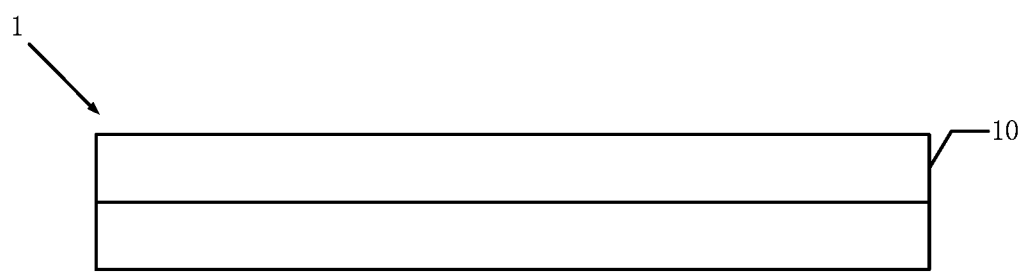
FIG. 7 is a schematic view showing a display device in Embodiment 3.

As shown in FIG. 7, the display device 1 of the present invention includes the display panel 10, wherein the display device 1 may be a device with a display screen, such as a mobile phone, a computer, or a television, etc., and all technical features of the display device 1 are all concentrated in the display panel 10, so the rest of the display device 1 will not be described herein for brevity.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising a display area, wherein the display area comprises an image capturing area and a non-image capturing area surrounding the image capturing area, and the display area further comprises:
   a plurality of light emitting units distributed in the image capturing area and the non-image capturing area; and
   a plurality of pixel circuit units, each of the plurality of pixel circuit units connected to a corresponding one of the plurality of light emitting units, wherein the plurality of pixel circuit units are only disposed in the non-image capturing area,
   wherein the plurality of light emitting units are arranged in a plurality of rows and columns of an array;
   wherein in a direction of the rows, the image capturing area has a first width; in a direction of the columns, the non-image capturing area has a first region, wherein a width of the first region and the first width of the image capturing area correspond to each other and are same;
   wherein in the direction of the columns, the image capturing area has a second width; in the direction of the rows, the non-image capturing area has a second region, and a width of the second region and the second width of the image capturing area correspond to each other and are same;
   wherein a region outside the second region and the first region in the non-image capturing area is a third region; and
   the plurality of pixel circuit units corresponding to the plurality of light emitting units in the image capturing area are all distributed in the first region and/or the second region; and
   wherein the first width is a maximum width of the image capturing area in the direction of the rows; in the direction of the columns, a first gap is located between two adjacent pixel circuit units in the first region, and a width of the first gap is gradually decreased in a direction from a side away from the image capturing area to a side close to the image capturing area.

2. The display panel according to claim 1, wherein
   the second width is a maximum width of the image capturing area in the direction of the columns;
   in the direction of the rows, a second gap is located between two adjacent pixel circuit units in the second region, wherein a width of the second gap is gradually decreased in the direction from a side away from the image capturing area to a side close to the image capturing area.

3. The display panel according to claim 1, wherein
   the first width is less than a maximum width of the image capturing area in the direction of the rows;
   the second width is less than a maximum width of the image capturing area in the direction of the columns;
   the third region and the image capturing area comprise at least one intersection disposed on a boundary of the image capturing area;
   in the direction of the columns, a third gap is located between two adjacent pixel circuit units in the first region, wherein a width of the third gap is gradually decreased in a direction from a side away from the image capturing area to a side close to the image capturing area; and
   in the direction of the rows, a fourth gap is located between two adjacent pixel circuit units in the second region, wherein a width of the fourth gap is gradually decreased in the direction from a side away from the image capturing area to a side close to the image capturing area.

4. The display panel according to claim 1, wherein the image capturing area is circular, and the first width and the second width are strings or diameters of the image capturing area.

5. The display panel according to claim 1, further comprising an array substrate, and the array substrate comprises a substrate on which a thin film transistor structure is disposed, wherein the thin film transistor structure comprises:
   an active layer disposed on the substrate;
   a first insulating layer disposed on the substrate and covering the active layer;
   a first metal layer disposed on the first insulating layer;
   a second insulating layer disposed on the first insulating layer and covering the first metal layer;
   a second metal layer disposed on the second insulating layer;
   a dielectric layer disposed on the second insulating layer and covering the second metal layer;
   a source/drain layer disposed on the dielectric layer, the source/drain layer penetrating the dielectric layer to the active layer and electrically connected to the active layer; and
   a planarization layer disposed on the dielectric layer and covering the source/drain layer, wherein
   the plurality of light emitting units comprise an electrode trace, the plurality of pixel circuit units comprise the source/drain layer, and the electrode trace is electrically connected to the source/drain layer.

6. The display panel according to claim 5, wherein each of the plurality of light emitting units further comprises:
   a pixel defining layer disposed on the electrode trace, wherein the pixel defining layer is provided with an opening corresponding to the electrode trace; and
   a light emitting layer disposed in the opening.

7. The display panel according to claim 6, wherein the electrode trace is disposed on the planarization layer, and the electrode trace is electrically connected to the source/drain layer through the planarization layer.

8. A display device comprising the display panel of claim 1.

9. The display device according to claim 8, wherein the plurality of light emitting units are arranged in the plurality of rows and columns of an array;
   in the direction of the rows, the image capturing area has the first width; in the direction of the columns, the non-image capturing area has the first region, wherein the width of the first region and the first width of the image capturing area correspond to each other and are same;
   in the direction of the columns, the image capturing area has a second width; in the direction of the rows, the non-image capturing area has a second region, and a width of the second region and the second width of the image capturing area correspond to each other and are same;
   a region outside the second region and the first region in the non-image capturing area is a third region; and the plurality of pixel circuit units corresponding to the plurality of light emitting units in the image capturing area are all distributed in the first region and/or the second region.

10. The display device according to claim 9, wherein the first width is the maximum width of the image capturing area in the direction of the rows;
in the direction of the columns, the first gap is located between two adjacent pixel circuit units in the first region, wherein the width of the first gap is gradually decreased in the direction from the side away from the image capturing area to the side close to the image capturing area.

11. The display device according to claim 9, wherein the second width is a maximum width of the image capturing area in the direction of the columns;
in the direction of the rows, a second gap is located between two adjacent pixel circuit units in the second region, wherein a width of the second gap is gradually decreased in the direction from the side away from the image capturing area to the side close to the image capturing area.

12. The display device according to claim 9, wherein the first width is less than the maximum width of the image capturing area in the direction of the rows;
the second width is less than a maximum width of the image capturing area in the direction of the columns;
the third region and the image capturing area comprise at least one intersection disposed on a boundary of the image capturing area;
in the direction of the columns, a third gap is located between two adjacent pixel circuit units in the first region, wherein a width of the third gap is gradually decreased in the direction from the side away from the image capturing area to the side close to the image capturing area; and
in the direction of the rows, a fourth gap is located between two adjacent pixel circuit units in the second region, wherein a width of the fourth gap is gradually decreased in the direction from the side away from the image capturing area to the side close to the image capturing area.

13. The display device according to claim 9, wherein the image capturing area is circular, and the first width and the second width are strings or diameters of the image capturing area.

14. The display device according to claim 8, wherein the display panel further comprises an array substrate, and the array substrate comprises a substrate on which a thin film transistor structure is disposed, wherein the thin film transistor structure comprises:
an active layer disposed on the substrate;
a first insulating layer disposed on the substrate and covering the active layer;
a first metal layer disposed on the first insulating layer;
a second insulating layer disposed on the first insulating layer and covering the first metal layer;
a second metal layer disposed on the second insulating layer;
a dielectric layer disposed on the second insulating layer and covering the second metal layer;
a source/drain layer disposed on the dielectric layer, the source/drain layer penetrating the dielectric layer to the active layer and electrically connected to the active layer; and
a planarization layer disposed on the dielectric layer and covering the source/drain layer, wherein
the plurality of light emitting units comprise an electrode trace, the plurality of pixel circuit units comprise the source/drain layer, and the electrode trace is electrically connected to the source/drain layer.

15. The display device according to claim 14, wherein each of the plurality of light emitting units further comprises:
a pixel defining layer disposed on the electrode trace, wherein the pixel defining layer is provided with an opening corresponding to the electrode trace; and
a light emitting layer disposed in the opening.

16. The display device according to claim 15, wherein the electrode trace is disposed on the planarization layer, and the electrode trace is electrically connected to the source/drain layer through the planarization layer.

* * * * *